United States Patent [19]

Sigal et al.

[11] Patent Number: 5,543,731
[45] Date of Patent: Aug. 6, 1996

[54] DYNAMIC AND PRESET STATIC MULTIPLEXER IN FRONT OF LATCH CIRCUIT FOR USE IN STATIC CIRCUITS

[75] Inventors: Leon J. Sigal, Monsey; James D. Warnock, Mohegan Lake, both of N.Y.

[73] Assignee: International Business Machines Corporation, Armonk, N.Y.

[21] Appl. No.: 414,412

[22] Filed: Mar. 31, 1995

[51] Int. Cl.$^6$ .................................................. H03K 19/00
[52] U.S. Cl. ........................ 326/40; 326/93; 327/408
[58] Field of Search ............................... 326/39–41, 93; 327/408

[56] References Cited

U.S. PATENT DOCUMENTS 4,692,634  9/1987  Fang et al. ........................ 327/408 X
4,709,173  11/1987  Nishimichi et al. .................... 327/408
4,868,413  9/1989  Oakland et al. ........................ 327/408
4,963,770  10/1990  Keida ...................................... 326/40
5,311,080  5/1994  Britton et al. .......................... 326/40
5,357,153  10/1994  Chiang et al. .......................... 326/40
5,396,127  3/1995  Chan et al. .......................... 326/40 X

*Primary Examiner*—David R. Hudspeth
*Attorney, Agent, or Firm*—Robert P. Tassinari, Jr.

[57] ABSTRACT

A latch circuit. The circuit includes a static digital logic circuit, comprising a multiplexer having a plurality of static input data lines and one or more select lines for selecting data from one of the input lines as multiplexer output data; latching means for latching output data from the multiplexer; wherein the multiplexer is not a static circuit.

5 Claims, 7 Drawing Sheets

N3, N4, N5, N6, and P7 are strong
P3, P4, P5, P6, and N7 are weak

DYNAMIC AND PRESET STATIC MULTIPLEXER IN FRONT OF LATCH CIRCUIT FOR USE IN STATIC CIRCUITS

FIELD OF THE INVENTION

The invention relates generally to digital circuits and in particular to latches in static digital circuits.

BACKGROUND OF THE INVENTION

FIG. 1 shows an implementation of a typical digital circuit. logic blocks 11, 13, etc., implement boolean logic functions on data that is stored in latch blocks 10, 12, 14, etc. A global clock signal synchronizes all latches so that data transfer from block 10 to 11 to 12 to 13 to 14 etc. proceeds in a uniform manner. Nearly all modern microprocessors, as well most other digital circuits, have this structure.

There are many ways in which logic blocks can be implemented. The most flexible approach is to use static logic. FIG. 2 shows a static logic implementation of Q=A * B+not_A * not_B (this is a CMOS technology example). Gate I1 inverts the logic value of input A and gate I2 inverts the logic value of input B. For example, when A is at logic level '1' (VDD) transistor N1 conducts and transistor P1 does not conduct. This forces node not_A to logic level '0' (GND). When A is at logic level '0' transistor P1 conducts and transistor N1 does not conduct. This forces node not_A to logic level '1'. So when both nodes A and B are at logic level '1' transistors N4 and N6 conduct while transistors P4 and P6 do not conduct. This pulls node S to '0'. Inverter I3 complements the value of node S. This generates A * B in the above equation. The table below shows the state of each node and transistor in FIG. 2 for each of the four possible combinations for signals A and B (ON means transistor is conducting while OFF means transistor is not conducting).

| A | B | | not_A | not_B | N3 | N4 | N5 | N6 | P3 | P4 | P5 | P6 | S | | Q |
|---|---|---|-------|-------|----|----|----|----|----|----|----|----|----|---|---|
| 0 | 0 | | 1 | 1 | ON | OFF | ON | OFF | OFF | ON | OFF | ON | 0 | | 1 |
| 0 | 1 | | 1 | 0 | ON | OFF | OFF | ON | OFF | ON | ON | OFF | 1 | | 0 |
| 1 | 0 | | 0 | 1 | OFF | ON | ON | OFF | ON | OFF | OFF | ON | 1 | | 0 |
| 1 | 1 | | 0 | 0 | OFF | ON | OFF | ON | ON | OFF | ON | OFF | 0 | | 1 |

The strength of the NFET and PFET transistors is controlled by their physical width: the wider the transistor the stronger it is. The strength, in turn, controls the delay characteristics of the associated gates. For example, if N1 in gate I1 is twice the strength of P1, then as node A undergoes a '0' to '1' transition gate I1 will pull down node not_A to logic level '0' twice as fast as when node A undergoes a '1' to '0' transition and gate I1 has to pull up node not_A to logic level '1'. Since when using static gates there is an equal chance between any given signal undergoing a '0' to '1' transition as it is for that signal to undergo a '1' to '0' transition, NFET and PFET transistors are sized with equal strength. This gives the best overall average gate delay. If it is known that signals can only transition unidirectionally (either only '0' to '1' or only '1' to '0') at predetermined times then gate delay can be made smaller by using one of either preset static or dynamic gates.

FIG. 3 is an example of a preset static gate designed under the assumption that inputs A, B, not_A, and not_B can only undergo '0' to '1' transitions. By taking advantage of this information, transistors N3, N4, N5, N6, and P7 can be made stronger as compared to transistors P3, P4, P5, P6, and N7. This allows the preset static gate to switch faster. Note that output Q also undergoes a '0' to '1' transition. Thus, one preset static gate can drive another preset static gate and maintain unidirectional transitions. Eventually, inputs A, B, not_A, and not_B will all undergo a '1' to '0' transition. However, since transistors P3, P4, P5, P6, and N7 are all weak it may take a long time for node S to go to logic level '1' and node Q to go to logic level '0'. To reduce this transition time, two more transistors (P8 and N8) are added to the circuit of FIG. 3, as shown in FIG. 4. In the circuit of FIG. 4, When CLOCK='1' P8 does not conduct, while N8 conducts. The circuit switches when either A and B or not_A and not_B undergo '0' to '1' transition. When CLOCK='0' N8 does not conduct and P8 conducts. P8 helps to restore node S to '1' and node Q to '0'.

The circuit of FIG. 4 can be made even faster by eliminating transistors P3, P4, P5, and P6, as shown in FIG. 5. This is a dynamic gate. Node S is precharged to logic level '1' by transistor P8 when CLOCK='0'. When CLOCK='1', if either A and B or not_A and not_B undergo a '0' to '1' transition, node S goes to '0' and node Q goes to '1'.

The main advantage of preset static and dynamic gates over static gate is that preset static and dynamic gates switch faster. When used throughout a digital system, however, these types of latches complicate the design due to three factors:

1. Circuits must be arranged in such a way that only unidirectional transitions are allowed in the critical paths.
2. The Clock needs to be wired not only to latches as shown in FIG. 1, but also to all logic gates.
3. More global wires are needed for routing in the system. In FIG. 2, complements of A and B are made locally. In FIGS. 4 and 5, all signals can undergo only '0' to '1' transition. This precludes local generation of required complement values, and signals not_A and not_B must be generated in the same block that A and B are generated in and brought in on global wires.

At present, many digital circuits are designed completely with static circuits. Such designs experience long delays in the multiplexers that feed the latches. Other designs use dynamic circuits and try to manage the increase in complexity. It is clear, however that neither of these solutions is completely satisfactory, and that an improved scheme would be extremely desirable.

SUMMARY OF THE INVENTION

The invention is a static digital logic circuit, comprising: a multiplexer having a plurality of static input data lines and one or more select lines for selecting data from one of the input lines as multiplexer output data; latching means for latching output data from the multiplexer; wherein the multiplexer is not a static circuit.

FIGURES

DETAILED DESCRIPTION

Figure 1:
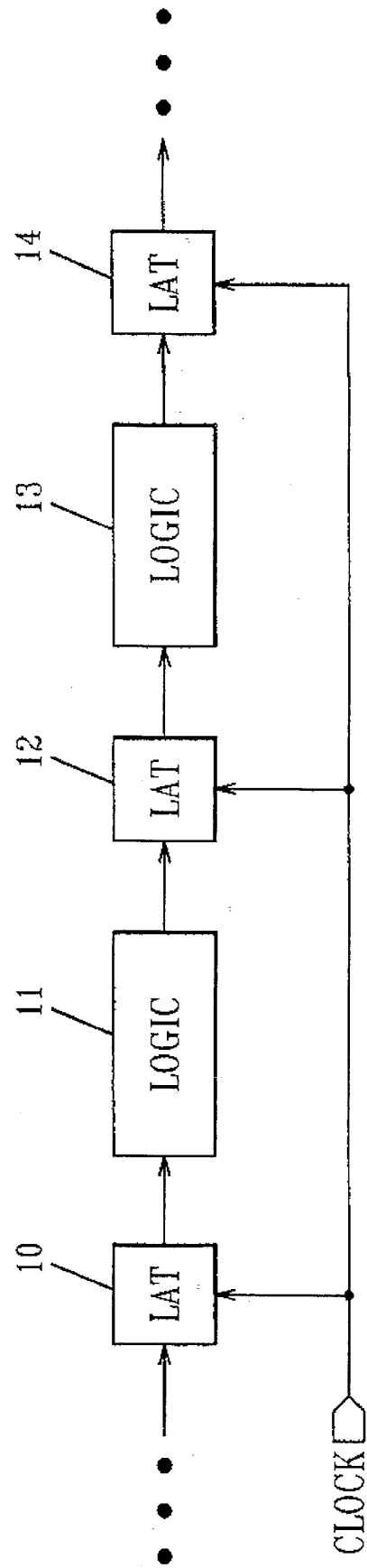
FIGS. 1–5 are depictions of prior art digital circuits.
Figure 2:
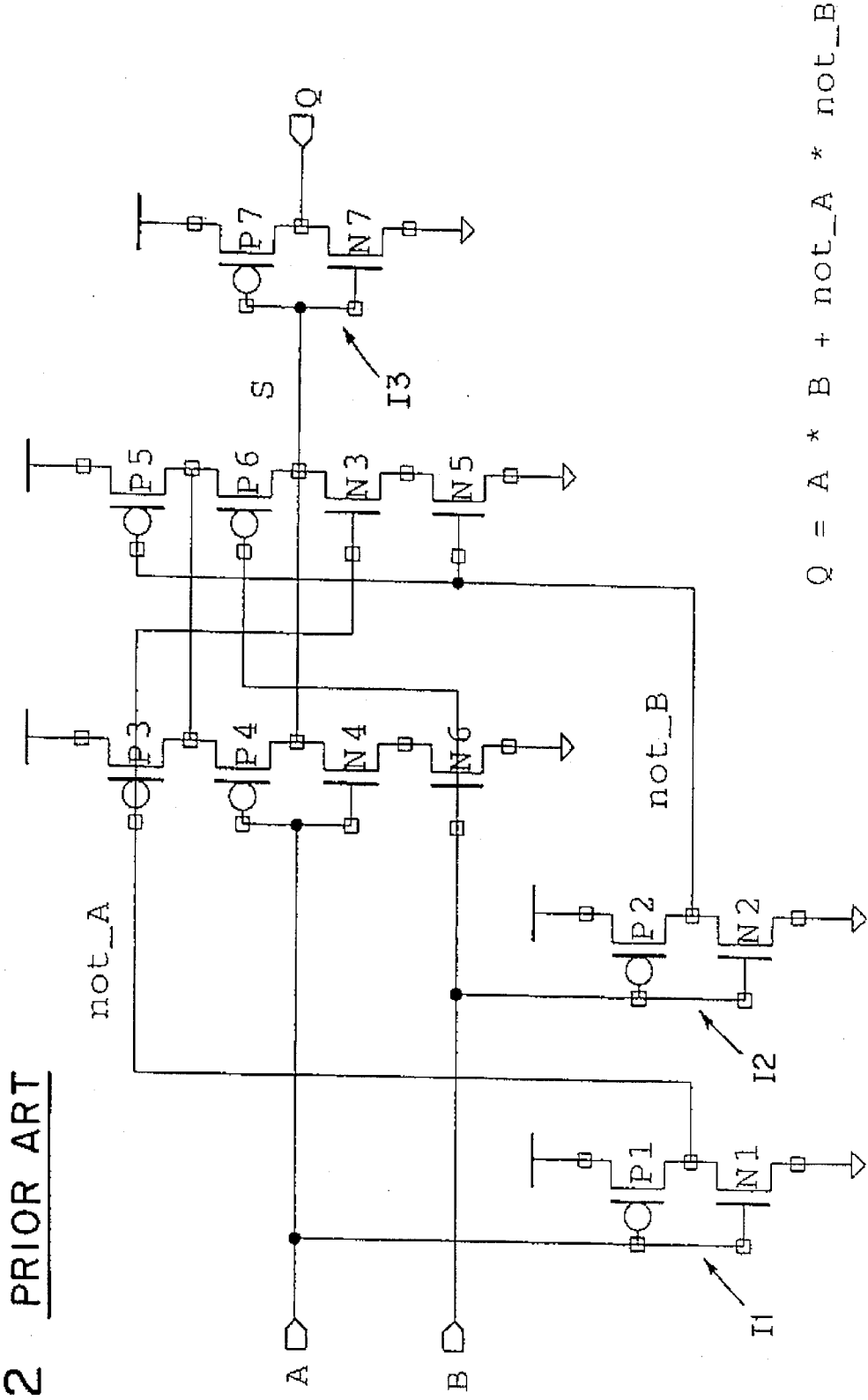
Figure 3:
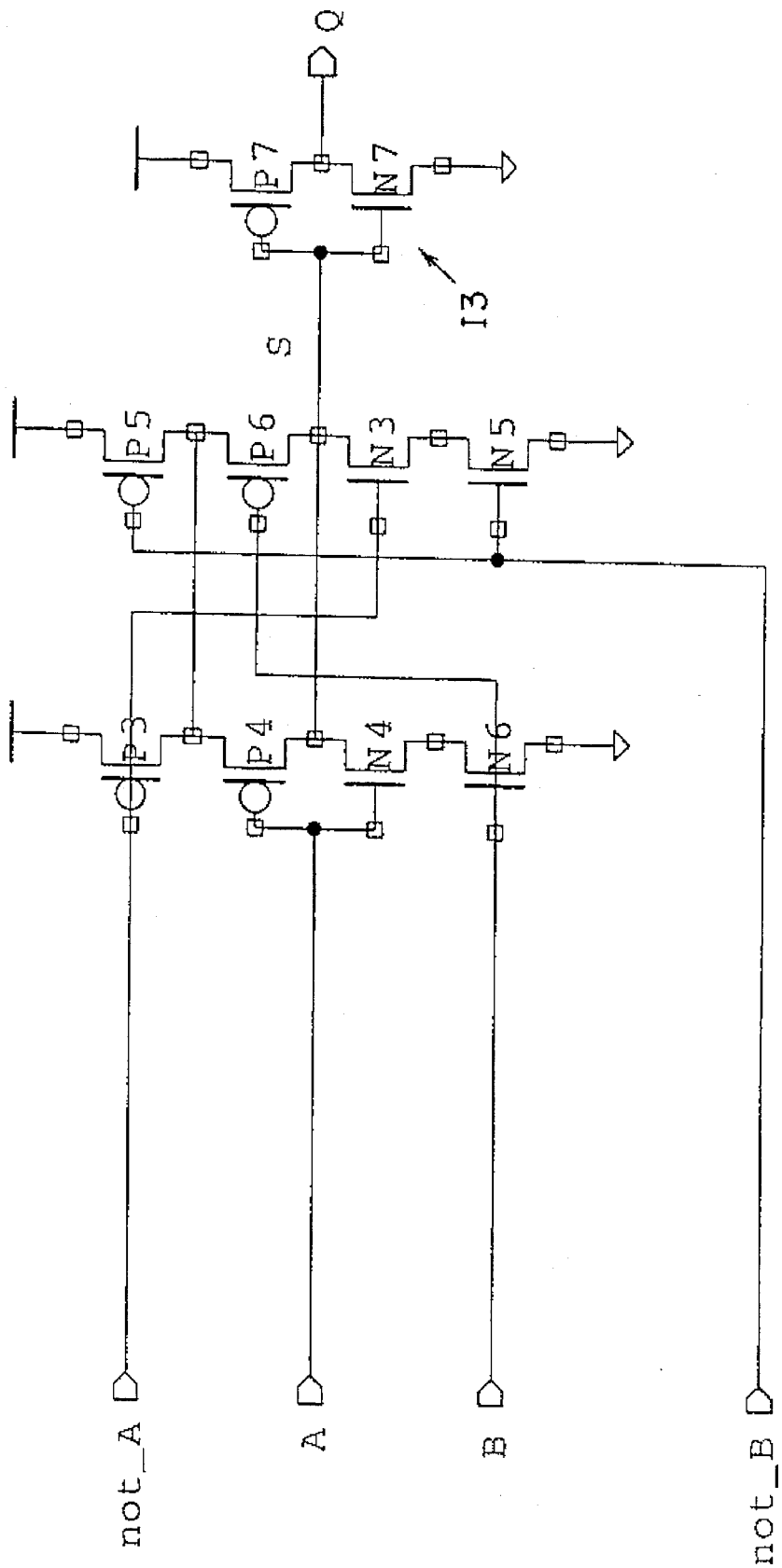
Figure 4:
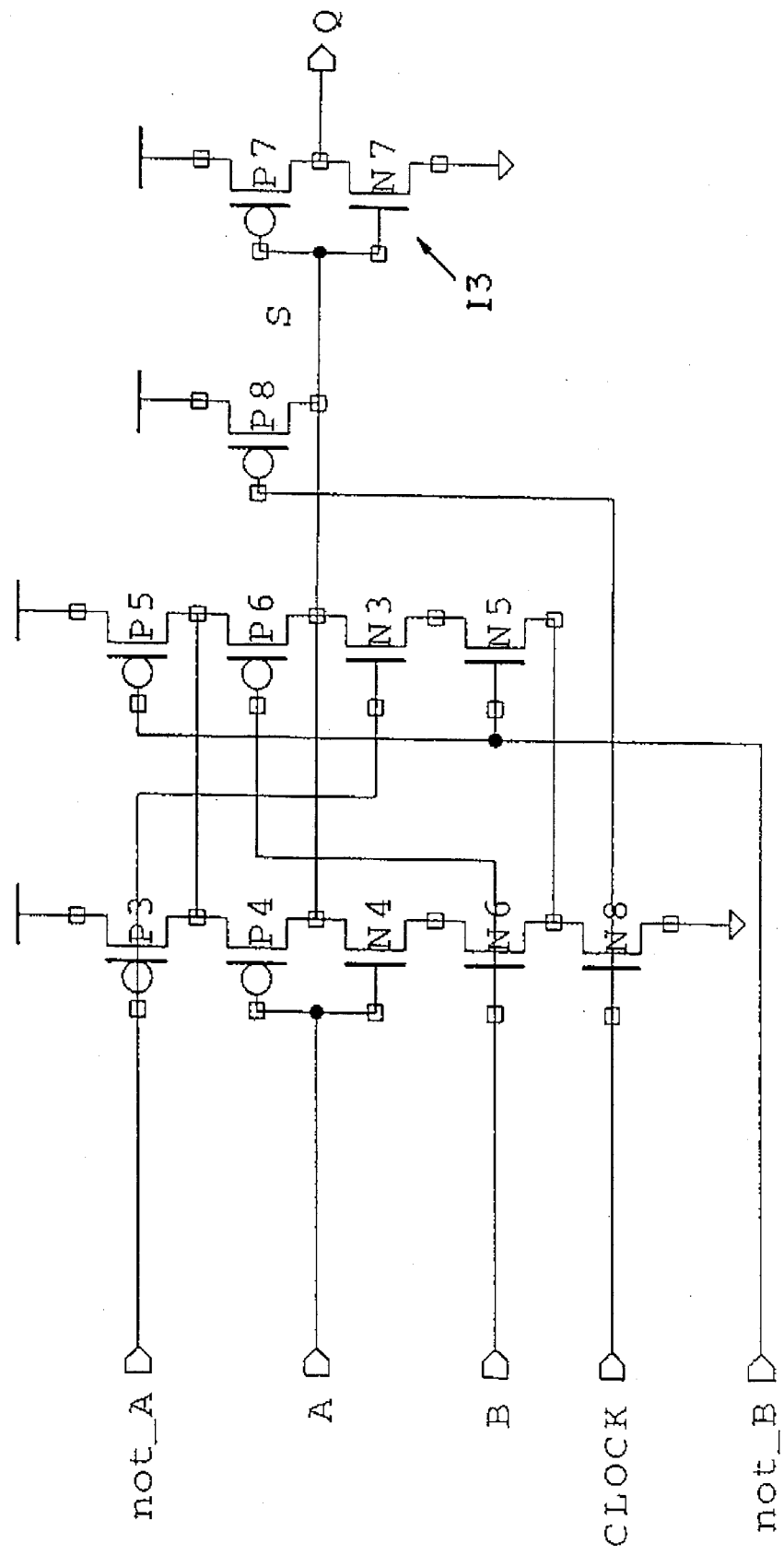
Figure 5:
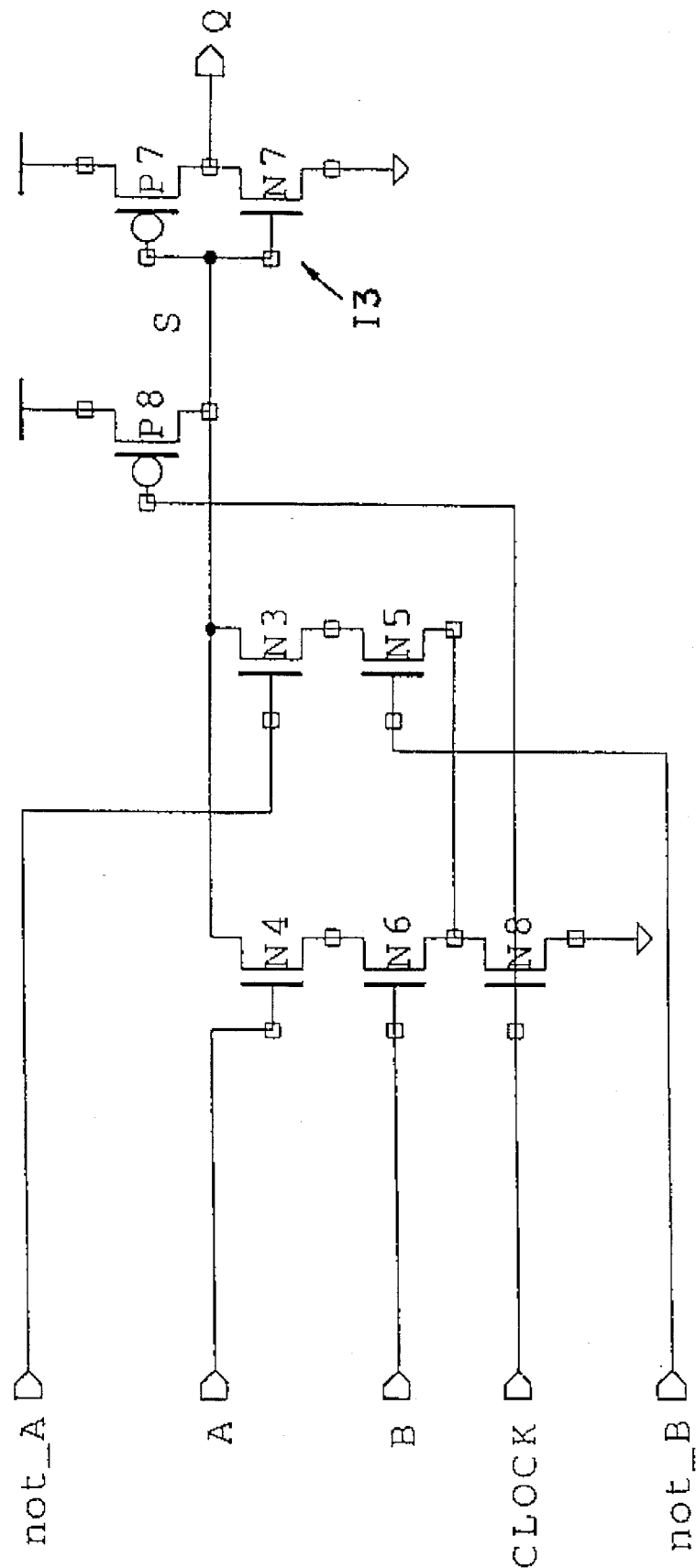

The present invention provides latches that have either a preset static or dynamic multiplexer built into the latch, the multiplexer and latch circuits being usable in static circuit designs. This improved scheme is faster than the prior art static circuits (e.g., FIG. 2) while maintaining the static nature of the rest of the design. Also, the three disadvantages mentioned above in the Background section are eliminated.

Figure 6:
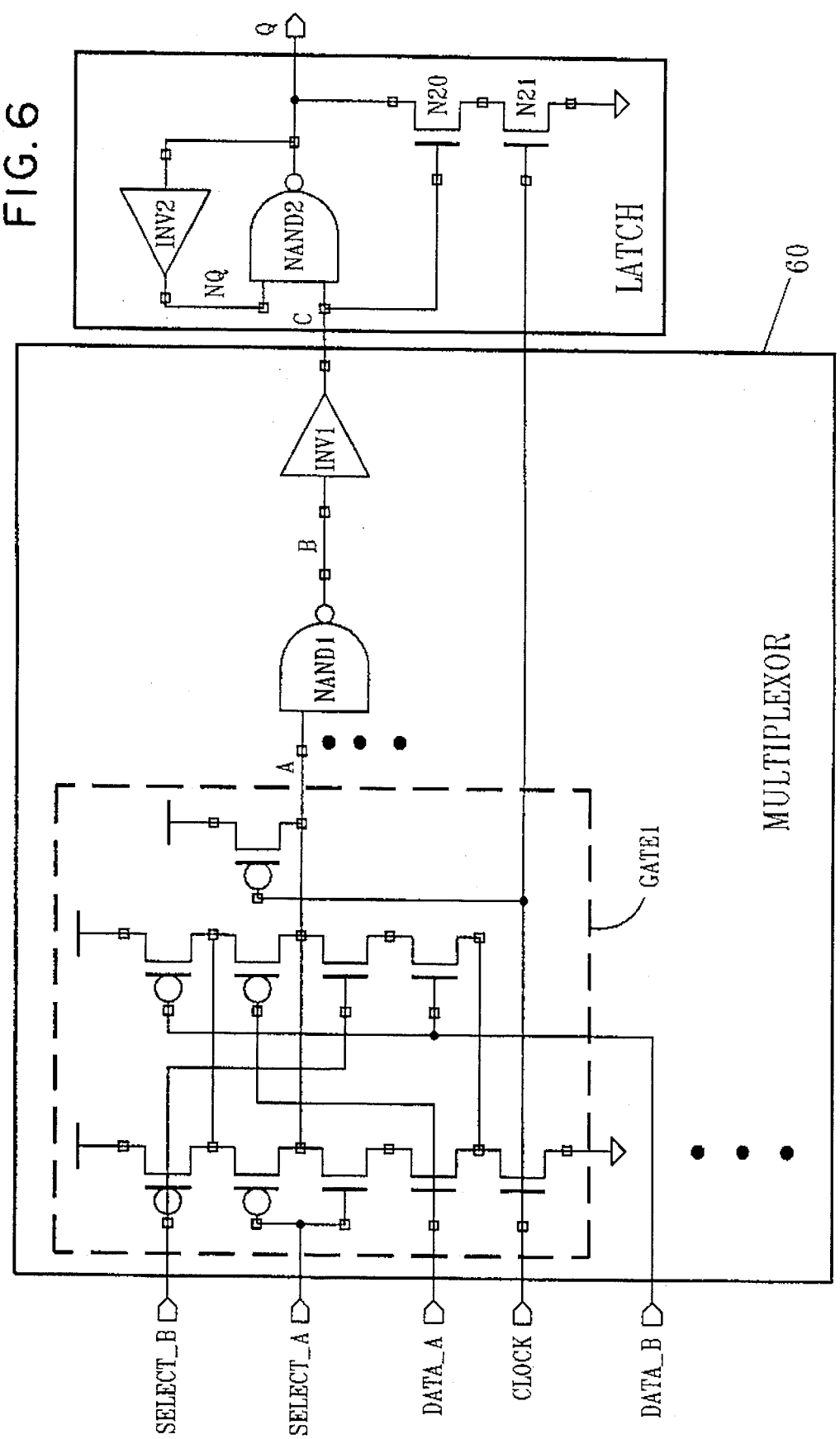
FIG. 6 is a latch having a built-in, preset static multiplexer in accordance with one aspect of the present invention.

FIG. 6 shows a preferred embodiment of a latch with a built-in preset static multiplexer 60. The clock circuit operates as follows In the case when CLOCK='0' node A is '1' node B is '0' and node C is '1'. NAND gate NAND2 has one of its inputs at '1' (node C) and therefore behaves as an inverter. Since CLOCK='0',transistor N21 does not conduct. Inverter INV2 and nand gate NAND2 (together with N20 and N21) behave as a latch: if node Q is '1' node NQ is '0', redriving node Q back to '1'. On the other hand, if node Q is '0' node NQ is '1', redriving node Q back to '0'. Thus, these devices form a latch. In the case where CLOCK='1' and port A is selected (i.e., SELECT_A is '1' and all other SELECTs are '0') then Q depends on DATA_ A. If DATA_A is '1' then node A is '0', node B is '1', node C is '0', and node Q goes to '1' If DATA A is '0' then node A is '1' node B is '0' node C is '1' and node Q goes to '0'.

All SELECT and DATA nodes can be static and must be stable before the rising edge of CLOCK. They can change after the falling edge of CLOCK. The rising edge of CLOCK provides the unidirectional transitions that are advantageous in our preset static multiplexer and latch. By using complex gate GATE1 and NAND1 it is possible to make very wide multiplexers (i.e., with many input and select lines).

Figure 7:
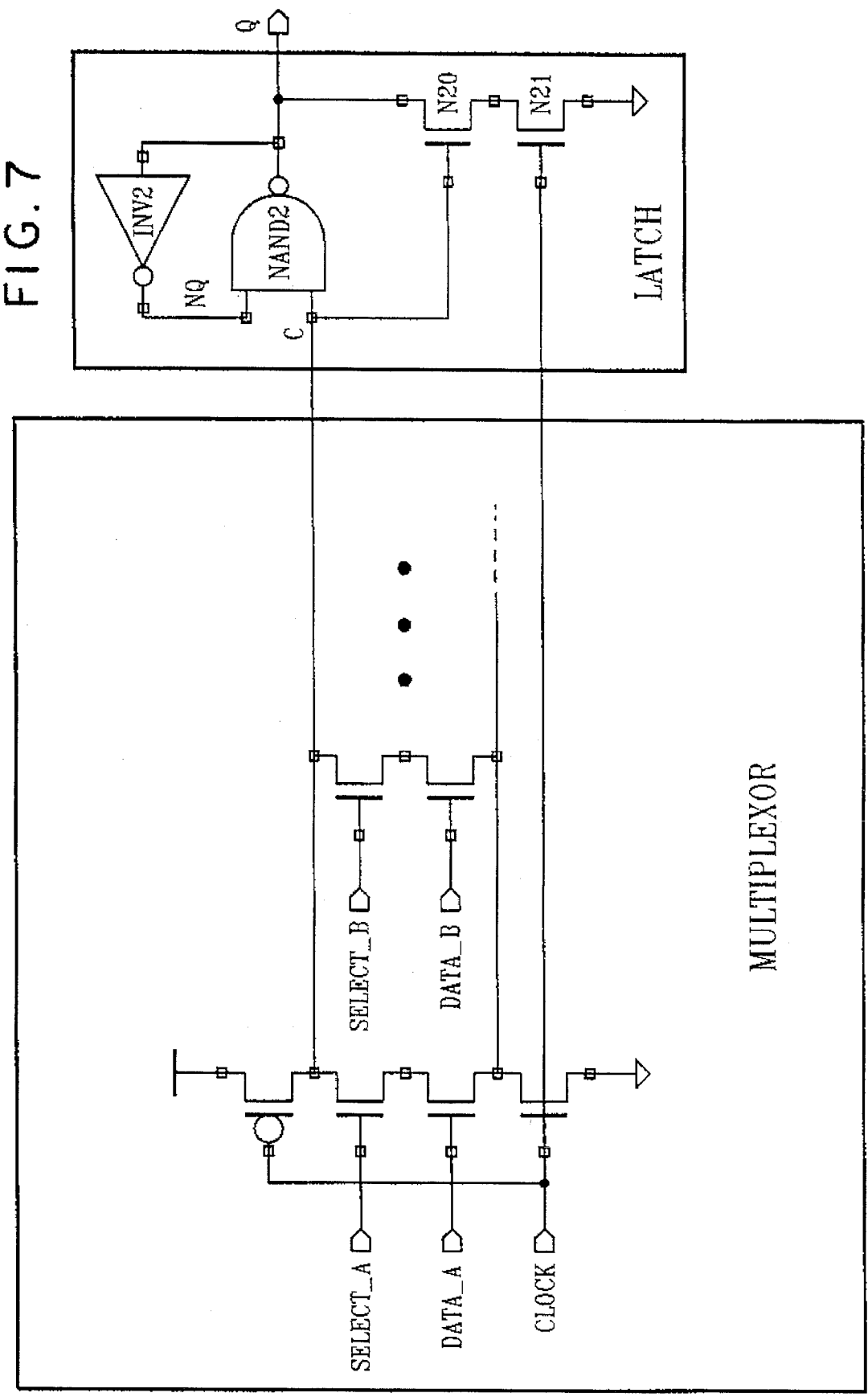
FIG. 7 is a latch having a built-in dynamic multiplexer in accordance with another aspect of the present invention.

FIG. 7 shows a preferred embodiment of a latch circuit with a built-in dynamic multiplexer in accordance with the present invention. The circuit can be used in an overall static circuit design When CLOCK='0' node C is '1'. The latch works as described above with respect to FIG. 6. When CLOCK='1' and port A is selected (i.e., SELECT_A is '1' and all other SELECTs are '0') then Q depends on DATA_ A. If DATA_A is '1' then node C is '0', and node Q goes to '1'. If DATA_A is '0' then node C is '1', and node Q goes to '0'. All SELECT and DATA nodes can be static and must be stable before the rising edge of CLOCK. The rising edge of CLOCK provides the unidirectional transitions that are advantageous in our dynamic multiplexer and latch.

The three complicating factors mentioned above in the Background section do not apply when using the present invention:

1. The SELECT and DATA lines need not be unidirectional. They need only be stable before CLOCK rises, and they can change after the falling edge of CLOCK. This is similar to the setup and hold requirements that are usually associated with latches.
2. There is no extra penalty for clock wiring, since clocks go to all latches.
3. There is no need for two sets of wires.

while the invention has been described particularly with respect to preferred embodiments thereof, it will be apparent that modifications to the disclosed embodiments can be effected without departing from the spirit and scope of the invention.

We claim:

1. A static digital logic circuit, comprising:

a preset static multiplexer having a plurality of static input data lines and one or more select lines for selecting data from one of the input lines as multiplexer output data;

latching means for latching output data from the multiplexer.

2. The circuit of claim 1, wherein the multiplexer comprises a gate, the gate receiving as input the data input data lines and the select lines, and having means responsive to the select inputs for selecting one of the data lines for storing data in the latch.

3. The circuit of claim 2 further comprising a clock coupled to the gate and the latching means, the clock having means for actuating the gate and latching means.

4. A circuit, comprising:

a preset static multiplexer having a plurality of static input data lines and one or more select lines for selecting data from one of the input lines as multiplexer output data; and a latch circuit coupled to receive output data from the multiplexer.

5. A circuit, comprising:

a preset static multiplexer having a plurality of input lines, a select line and an output line;

a latch coupled to the output line.

* * * * *